United States Patent
Yun et al.

(10) Patent No.: US 9,871,087 B2
(45) Date of Patent: Jan. 16, 2018

(54) ORGANIC LIGHT-EMITTING DIODE DISPLAY HAVING HIGH APERTURE RATIO AND METHOD FOR MANUFACTURING THE SAME

(71) Applicant: LG DISPLAY CO., LTD., Seoul (KR)

(72) Inventors: Jeonggi Yun, Paju-si (KR); Jeongoh Kim, Goyang-si (KR); Jungsun Beak, Paju-si (KR); Kyoungjin Nam, Paju-si (KR); Yongmin Kim, Anyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/940,931

(22) Filed: Nov. 13, 2015

(65) Prior Publication Data
US 2016/0141349 A1    May 19, 2016

(30) Foreign Application Priority Data

Nov. 13, 2014  (KR) .................... 10-2014-0158322

(51) Int. Cl.
*H01L 27/32*  (2006.01)

(52) U.S. Cl.
CPC ...... *H01L 27/3272* (2013.01); *H01L 27/3258* (2013.01); *H01L 27/3262* (2013.01); *H01L 27/3265* (2013.01); *H01L 27/322* (2013.01)

(58) Field of Classification Search
CPC ............. H01L 27/3272; H01L 27/3262; H01L 27/3258; H01L 27/3265; H01L 27/322
USPC .......................................................... 257/40
See application file for complete search history.

(56) References Cited

U.S. PATENT DOCUMENTS

| 2011/0147757 A1* | 6/2011 | Kim | H01L 29/78633 257/71 |
| 2012/0080681 A1* | 4/2012 | Kim | H01L 27/3262 257/59 |
| 2013/0119388 A1* | 5/2013 | Lee | H01L 51/5265 257/59 |
| 2013/0320314 A1* | 12/2013 | Kim | H01L 51/52 257/40 |
| 2014/0203262 A1* | 7/2014 | Kwak | G09G 3/3233 257/40 |
| 2014/0299843 A1* | 10/2014 | Kim | H01L 27/3265 257/40 |
| 2015/0115259 A1* | 4/2015 | Yamazaki | H01L 27/1225 257/43 |

* cited by examiner

*Primary Examiner* — Adam S Bowen
(74) *Attorney, Agent, or Firm* — Birch, Stewart, Kolasch & Birch, LLP

(57) ABSTRACT

An organic light-emitting diode display can include a substrate in which an emission area and a non-emission area are defined; a first transparent conductive layer, a light shielding layer, a buffer layer and a semiconductor layer sequentially laminated on the non-emission area; a gate electrode superposed on the center region of the semiconductor layer, having a gate insulating layer interposed therebetween; a drain electrode coming into contact with one side of the semiconductor layer, having an interlevel insulating layer covering the gate electrode interposed therebetween, and formed of a second transparent conductive layer and a metal layer laminated thereon; a first storage capacitor electrode disposed under the interlevel insulating layer in the emission area and formed of the first transparent conductive layer; and a second storage capacitor electrode superposed on the first storage capacitor electrode, having the interlevel insulating layer interposed therebetween, and formed of the second transparent conductive layer.

7 Claims, 17 Drawing Sheets

ORGANIC LIGHT-EMITTING DIODE DISPLAY HAVING HIGH APERTURE RATIO AND METHOD FOR MANUFACTURING THE SAME

This application claims the priority benefit of Korean Patent Application No. 10-2014-0158322 filed on Nov. 13, 2014, which is incorporated herein by reference for all purposes as if fully set forth herein.

BACKGROUND OF THE INVENTION

Field of the Invention

The present invention relates to an organic light-emitting diode display having an aperture ratio improved by forming a storage capacitor in an emission area using a transparent conductive material, and to a method for manufacturing the same. In addition, the present invention relates to an organic light-emitting diode display and a method for manufacturing the same for simplifying a manufacturing process by reducing the number of mask processes.

Discussion of the Related Art

Recently, a variety of flat panel displays having reduced weight and volume, compared to cathode ray tubes, has been developed. Such flat panel displays include liquid crystal displays (LCDs), field emission displays (FEDs), plasma display panels (PDPs), electroluminescent devices (ELs) and the like.

ELs are classified into an inorganic EL and an organic light-emitting diode display and are self-emissive devices having the advantages of high response speed, luminous efficiency and brightness and wide viewing angle.

FIG. 1 illustrates a structure of an organic light-emitting diode according to the related art. As show in FIG. 1, the organic light-emitting diode includes an organic electroluminescent compound layer, a cathode and an anode opposite to each other and having the organic electroluminescent compound layer interposed therebetween. The organic electroluminescent compound layer includes a hole injection layer (HIL), a hole transport layer (HTL), an emission layer (EML), an electron transport layer (ETL) and an electron injection layer (EIL).

The organic light-emitting diode emits light according to energy from excitons generated through a process in which holes and electrons injected to form the anode and the cathode are recombined in the EML. An organic light-emitting diode display displays images by electrically controlling the quantity of light generated in the EML of the organic light-emitting diode as shown in FIG. 1.

Organic light-emitting diode displays (OLEDDs) using the characteristics of the organic light-emitting diode which is an electroluminescent device are classified into a passive matrix type organic light-emitting diode display (PMOLED) and an active matrix type organic light-emitting diode display (AMOLED).

The AMOLED displays images by controlling current flowing through organic light-emitting diodes using a thin film transistor (referred to as TFT hereinafter).

FIG. 2 is an equivalent circuit diagram illustrating a structure of one pixel of an organic light-emitting diode display according to the related art, FIG. 3 is a plan view of the structure of one pixel of the organic light-emitting diode display according to the related art and FIG. 4 is a cross-sectional view illustrating the structure of the conventional organic light-emitting diode display, taken along line I-I' of FIG. 3.

Referring to FIGS. 2 and 3, an AMOLED includes a switching TFT (TFT) ST, a driving TFT DT connected to the switching TFT ST and an organic light-emitting diode OLED in contact with the driving TFT DT.

The switching TFT ST is formed at an intersection of a scan line SL and a data line DL and serves to select a pixel. The switching TFT ST includes a gate electrode SG, a semiconductor layer SA, a source electrode SS and a drain electrode SD. The driving TFT DT drives an organic light-emitting diode OLED of a pixel selected by the switching TFT ST. The driving TFT DT includes a gate electrode DG connected to the drain electrode SD of the switching TFT ST, a semiconductor layer DA, a source electrode DS connected to a driving current line VDD and a drain electrode DD. The drain electrode DD of the driving TFT DT is connected to an anode ANO of the organic light-emitting diode OLED.

More specifically, referring to FIG. 4, the gate electrodes SG and DG of the switching TFT ST and the driving TFT DT are formed on a substrate SUB of the AMOLED. A gate insulating layer GI is formed on the gate electrodes SG and DG. The semiconductor layers SA and DA are formed on portions of the gate insulating layer GI, which correspond to the gate electrodes SG and DG. The source electrode SS and the drain electrode SD are formed on the semiconductor layer SA, opposite to each other having a predetermined gap provided therebetween. The source electrode DS and the drain electrode DD are formed on the semiconductor layer DA, opposite to each other having a predetermined gap provided therebetween. The drain electrode SD of the switching TFT ST is connected to the gate electrode DG of the driving TFT DT via a contact hole formed in the gate insulating layer GI. A passivation layer PAS is formed on the overall surface of the substrate so as to cover the switching TFT ST and the driving TFT DT having the aforementioned structure.

When the semiconductor layers SA and DA are formed of an oxide semiconductor material, a high resolution and fast driving speed can be achieved in a large TFT substrate having large charging capacity due to the oxide semiconductor's high mobility. The oxide semiconductor material layers may further include etch stoppers SE and DE for protecting the surfaces thereof from an etchant in order to ensure device stability. Specifically, the etch stoppers SE and DE are formed so as to prevent the semiconductor layers SA and DA from being back-etched due to an etchant contacting the exposed surfaces of the semiconductor layers SA and DA, which correspond to the gaps between the source electrodes SS and DS and the drain electrodes SD and DD.

A color filter CF is formed in a region corresponding to the anode ANO which will be formed later. The color filter CF is preferably formed to occupy a wide area if possible. For example, the color filter CF is formed such that the color filter CF is superposed on a wide area including the data line DL, driving current line VDD and scan line SL. The substrate on which the color filter CF has been formed has an uneven surface and many stepped portions since a lot of components have been formed thereon. Accordingly, an overcoat layer OC is formed on the overall surface of the substrate in order to planarize the surface of the substrate.

Subsequently, the anode ANO of the OLED is formed on the overcoat layer OC. Here, the anode ANO is connected to the drain electrode DD of the driving TFT DT via a contact hole formed in the overcoat layer OC and the passivation layer PAS.

A bank pattern BN for defining a pixel region is formed on the switching TFT ST, the driving TFT DT and the interconnection lines DL, SL and VDD formed on the substrate on which the anode ANO is formed.

The anode ANO exposed through the bank pattern BN becomes an emission area. An organic emission layer OLE and a cathode layer CAT are sequentially formed on the anode ANO exposed through the bank pattern BN. When the organic emission layer OLE is formed of an organic material emitting white light, the organic emission layer OLE expresses a color assigned to each pixel according to the color filter CF located under the organic emission layer OLE. The organic light-emitting diode display having the structure as shown in FIG. 4 is a bottom emission display which emits light downwardly.

In such a bottom emission organic light-emitting diode display, a storage capacitor STG is formed in a space in which the anode ANO is superposed on the gate electrode DG of the driving TFT DT. The organic light-emitting diode display displays image information by driving organic light-emitting diodes. Here, a considerably large amount of energy is necessary to drive the organic light-emitting diodes. Accordingly, a large-capacity storage capacitor is needed in order to correctly display image information having rapidly changing data values, such as video.

To secure a storage capacitor having sufficient capacity, a storage capacitor electrode needs to have a sufficiently large area. In the bottom emission organic light-emitting diode display, a light emitting area, that is, an aperture ratio, decreases as the storage capacitor area increases. In a top emission organic light-emitting diode display, the storage capacitor can be formed under the emission area and thus the aperture ratio does not decrease even when a large-area storage capacitor is designed. However, the area of the storage capacitor is directly related to aperture ratio decrease in the bottom emission organic light-emitting diode display.

To manufacture such an organic light-emitting diode display, a photolithography process using a photo-mask is performed multiple times. Each mask process includes cleaning, exposure, development, etching and the like. When the number of mask processes increases, time and costs for manufacturing the organic light-emitting diode display and a defect generation rate increase, decreasing production yield. Accordingly, it is necessary to reduce the number of mask processes in order to decrease manufacturing costs and improve production yield and production efficiency.

SUMMARY OF THE INVENTION

To solve the aforementioned problems and other limitations associated with the related art, the present invention provides an organic light-emitting diode display and a method for manufacturing the same for securing a storage capacitor having sufficient capacity without decreasing an aperture ratio by forming the storage capacitor in an emission area using a transparent storage capacitor electrode. Another object of the present invention is to provide an organic light-emitting diode display and a method for manufacturing the same for simplifying a manufacturing process by reducing the number of mask processes.

In one aspect, an organic light-emitting diode display includes a substrate in which an emission area and a non-emission area are defined; a first transparent conductive layer, a light shielding layer, a buffer layer and a semiconductor layer sequentially laminated on the non-emission area; a gate electrode superposed on the center region of the semiconductor layer, having a gate insulating layer interposed therebetween; a drain electrode coming into contact with one side of the semiconductor layer, having an interlevel insulating layer covering the gate electrode interposed therebetween, and formed of a second transparent conductive layer and a metal layer laminated thereon; a first storage capacitor electrode disposed under the interlevel insulating layer in the emission area and formed of the first transparent conductive layer; and a second storage capacitor electrode superposed on the first storage capacitor electrode, having the interlevel insulating layer interposed therebetween, and formed of the second transparent conductive layer.

In another aspect, a method for manufacturing an organic light-emitting diode display includes forming a first transparent conductive layer, a light shielding layer, a buffer layer and a semiconductor layer on a non-emission area of a substrate using a first transparent conductive material, a light shielding material, an insulating material and a semiconductor material, respectively, and forming a first storage capacitor electrode on an emission area of the substrate using the first transparent conductive material; forming a gate electrode superposed on the center region of the semiconductor layer, having a gate insulating layer interposed therebetween; forming an interlevel insulating layer on the overall surface of the substrate on which the gate electrode is formed; and forming, on the interlevel insulating layer, a drain electrode coming into contact with one side of the semiconductor layer and formed of a second transparent conductive layer and a metal layer laminated thereon, a source electrode coming into contact with the other side of the semiconductor layer and formed of the second transparent conductive layer and the metal layer laminated thereon, and a second storage capacitor electrode superposed on the first storage capacitor electrode and formed of the second transparent conductive layer of the drain electrode, extended to the emission area.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

First Embodiment

Figure 1:
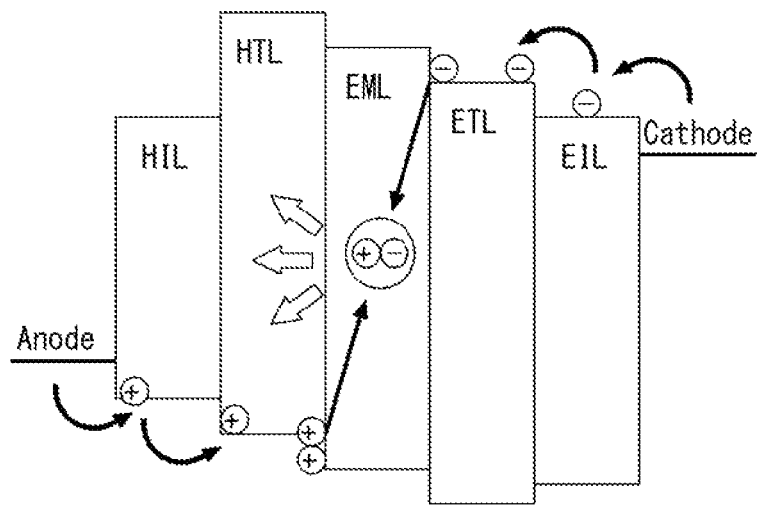
FIG. 1 illustrates an organic light-emitting diode display according to the related art.
Figure 2:
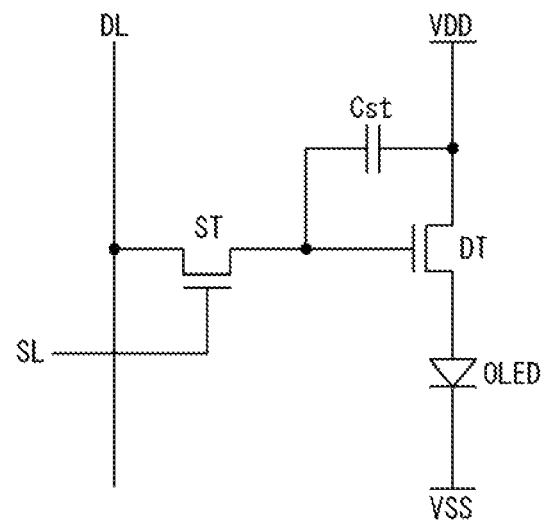
FIG. 2 is an equivalent circuit diagram illustrating a structure of one pixel of the organic light-emitting diode display according to the related art.
Figure 3:
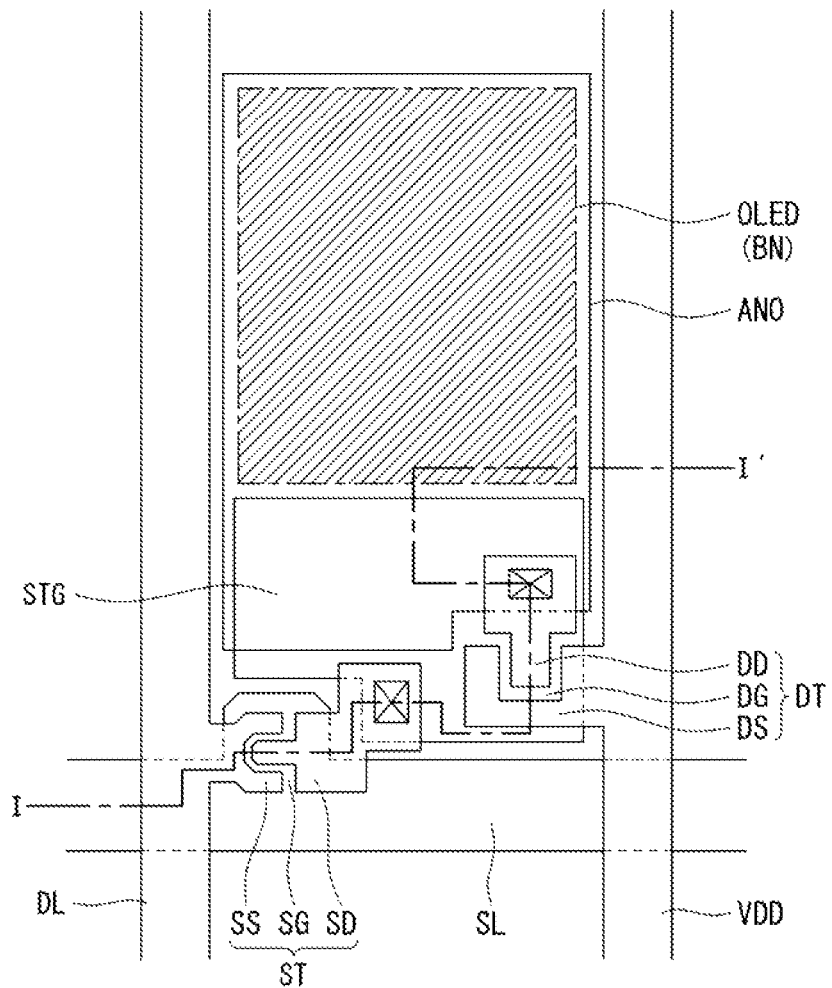
FIG. 3 is a plan view illustrating the structure of one pixel of the organic light-emitting diode display according to the related art.
Figure 4:
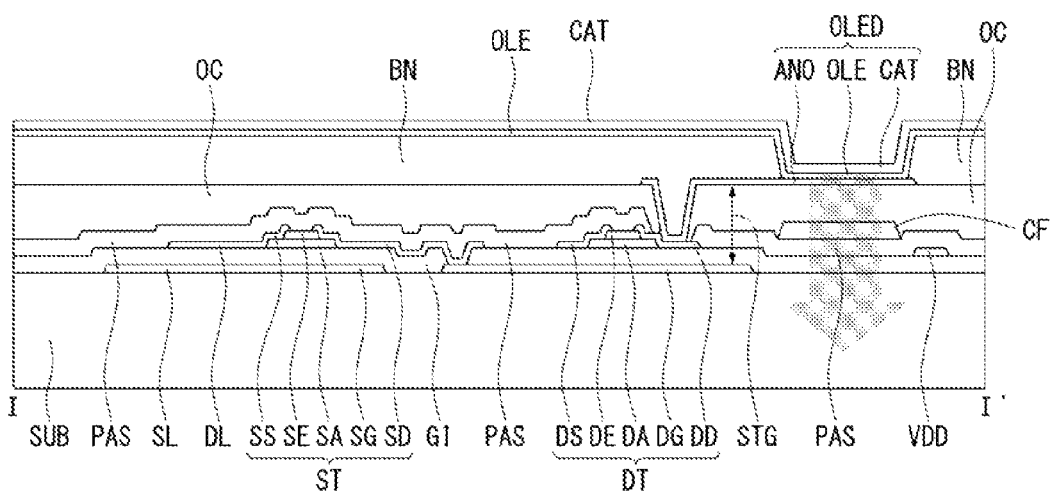
FIG. 4 is a cross-sectional view illustrating the structure of one pixel of the conventional organic light-emitting diode display, taken along line I-I' of FIG. 3.
Figure 5:
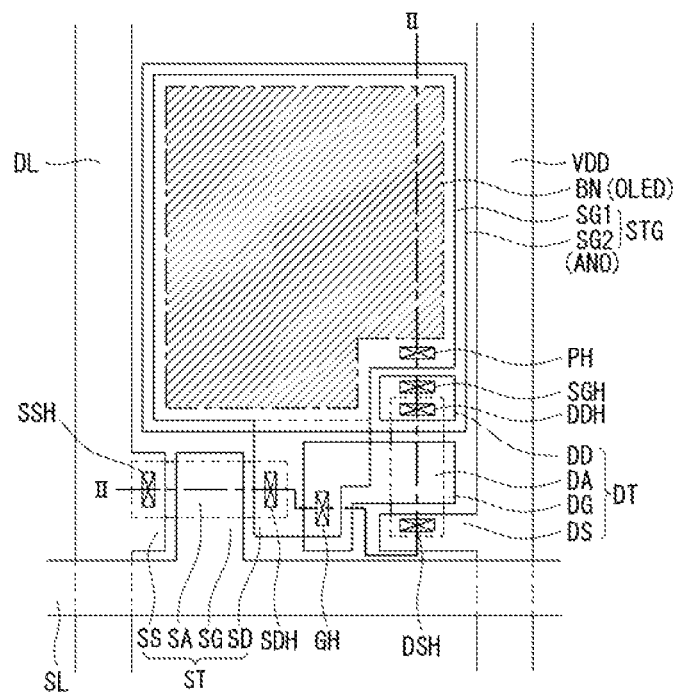
FIG. 5 is a plan view illustrating a structure of an organic light-emitting diode display according to a first embodiment of the present invention.
Figure 6:
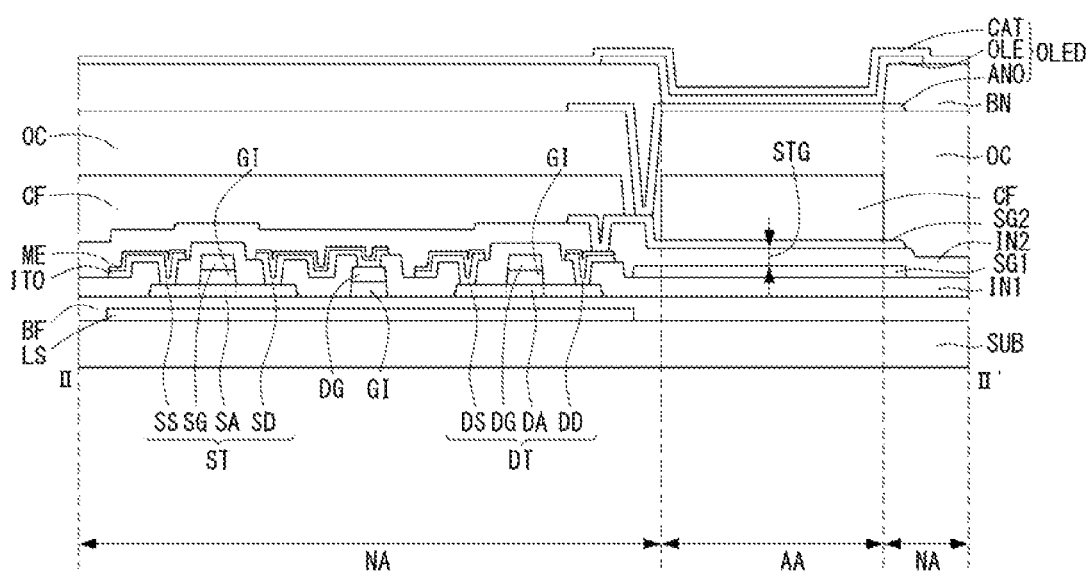
FIG. 6 is a cross-sectional view illustrating the structure of the organic light-emitting diode display according to the first embodiment of the present invention, taken along line II-II' of FIG. 5.

A description will be given of an organic light-emitting diode display according to a first embodiment of the present invention with reference to FIGS. 5 and 6. FIG. 5 is a plan view illustrating a structure of an organic light-emitting diode display according to the first embodiment of the present invention and FIG. 6 is a cross-sectional view illustrating the structure of the organic light-emitting diode display according to the first embodiment of the present invention, taken along line II-II' of FIG. 5. All the components of the organic light-emitting diode display according to this embodiment and all other embodiments are operatively coupled and configured.

Referring to FIGS. 5 and 6, the organic light-emitting diode display according to the first embodiment of the present invention includes a substrate SUB in which an emission area AA and a non-emission area NA are defined, a switching TFT ST, a driving TFT DT connected to the switching TFT ST, a second storage capacitor electrode SG2 in contact with the driving TFT DT, a storage capacitor STG formed by a first storage capacitor electrode SG1 and the second storage capacitor electrode SG2 superposed thereon, and an organic light-emitting diode OLED connected to the driving TFT DT through the second storage capacitor electrode SG2. The storage capacitor STG and the organic light-emitting diode OLED are formed in the emission area AA and the TFTs ST and DT or interconnection lines SL, DL and VDD are formed in the non-emission area NA.

Scan lines SL and data lines DL are formed on the substrate SUB in a matrix form so as to define pixels. The switching TFT ST is formed at an intersection of a scan line SL and a data line DL and serves to select a pixel. The switching TFT ST includes a switching gate electrode SG, a channel layer SA, a switching source electrode SS and a switching drain electrode SD. The switching gate electrode SG is connected to the scan line SL and the switching source electrode SS is branched from the data line DL.

The driving TFT DT includes a driving gate electrode DG, a channel layer DA, a driving source electrode DS and a driving drain electrode DD. The driving gate electrode DG is connected to the switching drain electrode SD and the driving source electrode DS is branched from the driving current line VDD.

A passivation layer IN2 is formed to cover the source electrodes SS and DS and the drain electrodes SD and DD of the TFTs ST and DT while exposing part of the driving drain electrode DD. The second storage capacitor electrode SG2 is formed on the passivation layer IN2 so as to come into contact with part of the driving drain electrode DD. Here, the second storage capacitor electrode SG2 is superposed on the first storage capacitor electrode SG1, which is formed when the source electrodes SS and DS and the drain electrodes SD and DD of the TFTs ST and DT are formed, having the passivation layer IN2 interposed therebetween so as to form the storage capacitor STG.

Since the storage capacitor STG is formed in such a manner that the second storage capacitor electrode SG2 formed of a transparent conductive material is superposed on the first storage capacitor electrode SG1 formed of a transparent conductive material, the storage capacitor STG can have a large area without reducing the aperture ratio in the emission area AA. Accordingly, the organic light-emitting diode display according to the first embodiment of the present invention can secure the storage capacitor STG having sufficient capacity.

Color filters CF may be formed on the second storage capacitor electrode SG2 in the emission area AA such that the color filters CF respectively correspond to pixel regions. Here, red, green and blue color filters CF may be sequentially disposed and the color filters CF may further include a white color filter CF. Red and/or green color filters CF may be extended and formed on the portion in which the TFTs ST and DT are formed in the pixel region so as to cover the TFTs ST and DT.

An overcoat layer OC, which exposes part of the second storage capacitor electrode SG2, is formed on the overall surface of the substrate SUB on which the color filters CF are formed. The overcoat layer OC is coated on the overall surface of the substrate SUB in order to planarize the surface of the substrate SUB on which the color filters CF are formed.

An anode ANO is formed on the overcoat layer OC to come into contact with the second storage capacitor electrode SG2. The anode ANO is electrically connected to the drain electrode DD of the driving TFT through the second storage capacitor electrode SG2.

A bank BN, which exposes part of the anode ANO, is formed on the anode ANO. An organic emission layer OLE is formed on part of the bank BN and the exposed portion of the anode ANO, and a cathode CAT is formed on the organic emission layer OLE so as to cover the organic emission layer OLE. In this manner, an organic light-emitting diode OLED including the anode ANO, the organic emission layer OLE and the cathode CAT is completed.

A description will be given of a process of manufacturing the organic light-emitting diode display according to the first embodiment of the present invention with reference to FIGS. 7A to 7J. Various features of the organic light-emitting diode display according to the first embodiment of the present invention are described in more detail through the manufacturing process. FIGS. 7A to 7J are cross-sectional views illustrating a method for manufacturing the organic light-emitting diode display according to the first embodiment of the present invention.

Figure 7A:
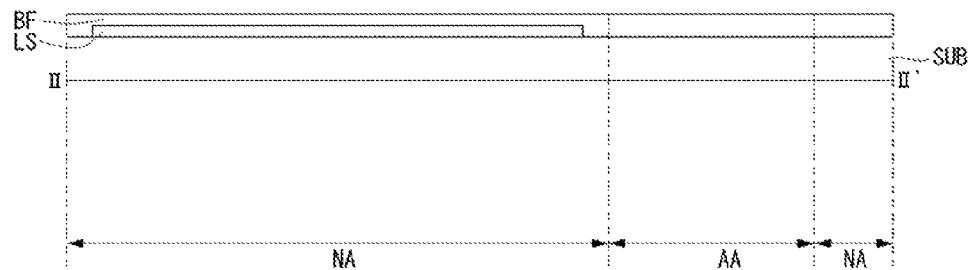
FIGS. 7A to 7J are cross-sectional views illustrating a method for manufacturing the organic light-emitting diode display according to the first embodiment of the present invention.

Referring to FIG. 7A, an opaque light shielding material is coated on the overall surface of the substrate SUB and patterned through a first mask process to form a light shielding layer LS. It is desirable to form the light shielding layer LS such that semiconductor layers, particularly, channel regions of the TFTs, which will be formed later, are disposed on the light shielding layer LS. The light shielding layer LS serves to protect oxide semiconductor elements from external light. An insulating material is coated on the overall surface of the substrate SUB on which the light shielding layer LS is formed so as to form a buffer layer BF.

Figure 7B:
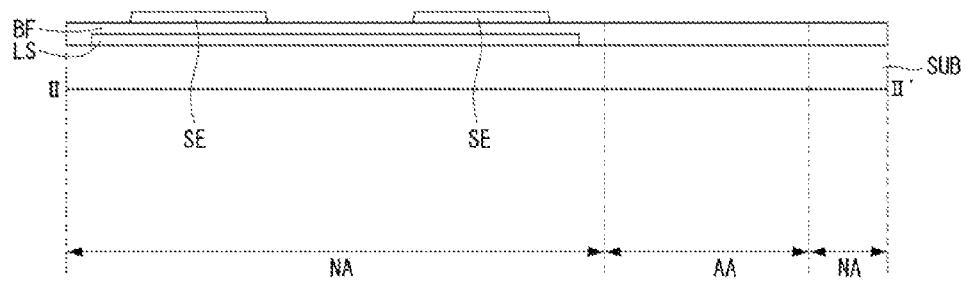

Referring to FIG. 7B, a semiconductor material is coated on the overall surface of the substrate SUB on which the buffer layer BF is formed. The semiconductor material may include an oxide semiconductor material such as indium gallium zinc oxide (IGZO). The semiconductor material layer is patterned through a second mask process to form semiconductor layers SE.

Figure 7C:
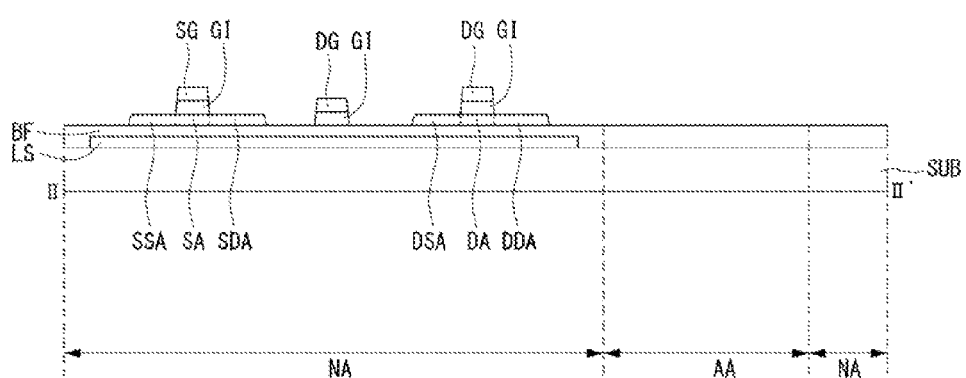

Referring to FIG. 7C, an insulating material and a metal material are sequentially coated on the overall surface of the substrate SUB on which the semiconductor layers SE are formed and simultaneously patterned through a third mask process to form a gate insulating layer GI and the gate electrodes SG and DG superposed thereon. The gate electrodes SG and DG are preferably formed such that the gate electrodes SG and DG are disposed on the center regions of the semiconductor layers SE while exposing both sides of the semiconductor layers SE. The center regions of the semiconductor layers SE are respectively defined as a channel layer SA of the switching TFT and a channel layer DA of the driving TFT. The exposed portions of the semiconductor layers SE become source regions SSA and DSA and drain regions SDA and DDA respectively coming into contact with the source electrodes and the drain electrodes of the switching TFT and the driving TFT. When the semiconductor material is an oxide semiconductor material, the source regions SSA and DSA and the drain regions SDA and DDA may be conductorized through a plasma treatment process.

Figure 7D:
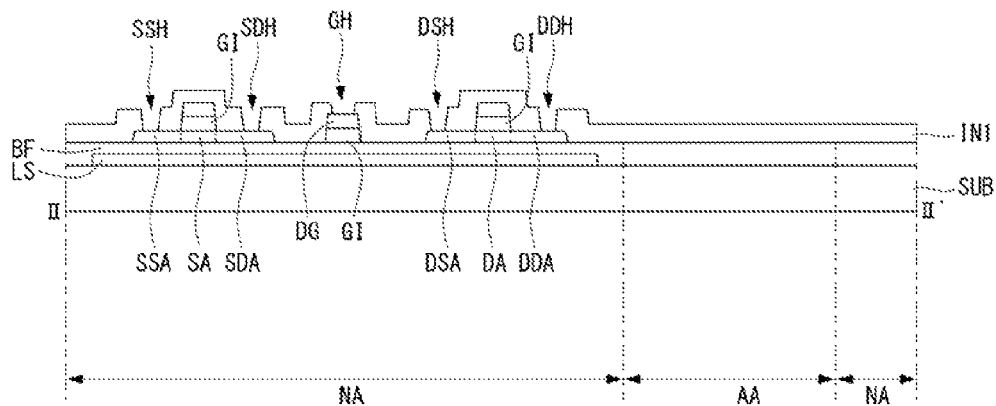

Referring to FIG. 7D, an insulating material is coated on the overall surface of the substrate SUB on which the gate electrodes SG and DG are formed so as to form an interlevel insulating layer IN1. The interlevel insulating layer IN1 is patterned through a fourth mask process to form contact holes SSH and DSH for exposing the source regions SSA and DSA of the semiconductor layers and contact holes SDH and DDH for exposing the drain electrodes SDA and DDA of the semiconductor layers. Here, a gate contact hole GH for exposing part of the gate electrode DG of the driving TFT is simultaneously formed.

Figure 7E:
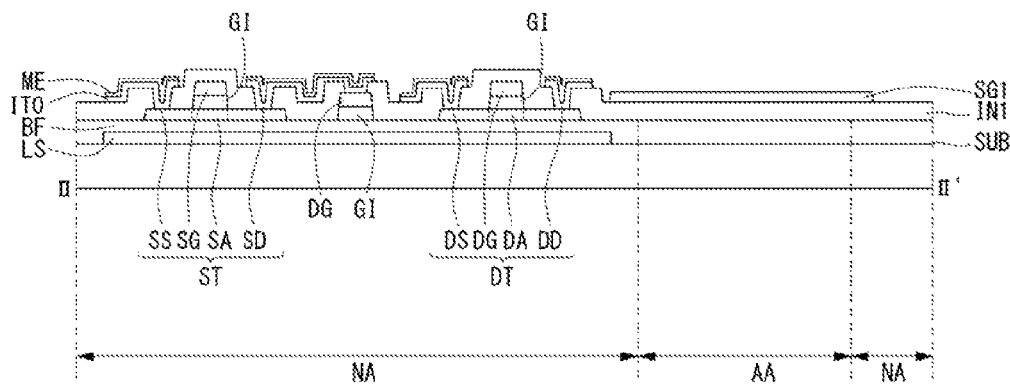

Referring to FIG. 7E, a transparent conductive material and a metal material are sequentially coated on the interlevel insulating layer IN1 in which the contact holes are formed. The transparent conductive material may be indium tin oxide, indium zinc oxide, indium tin zinc oxide or the like. The transparent conductive material layer and the metal material layer are patterned through a fifth mask process to form the source electrode SS and the drain electrode SD of the switching TFT ST and the source electrode DS and the drain electrode DD of the driving TFT DT. The first storage capacitor electrode SG1 is formed of the transparent conductive material in the emission area AA. Here, the drain electrode SD of the switching TFT is connected to the gate electrode DG of the driving TFT.

The fifth mask process is performed using a half-tone mask. By using the half-tone mask, the source electrode SS and the drain electrode SD of the switching TFT ST and the source electrode DS and the drain electrode DD of the driving TFT DT are formed of a double layer including the transparent conductor layer ITO and the metal material ME, and the first storage capacitor electrode SG1 is formed of a single layer including only the transparent conductive layer ITO. While the source electrodes SS and DS and the drain electrodes SD and DD of the TFTs ST and DT may be formed of a single layer including only the transparent conductive material ITO, it is desirable that the source electrodes SS and DS and the drain electrodes SD and DD be formed of a double layer including the laminated transparent conductive material ITO and metal material ME, considering that the transparent conductive material ITO has high sheet resistance.

Figure 7F:
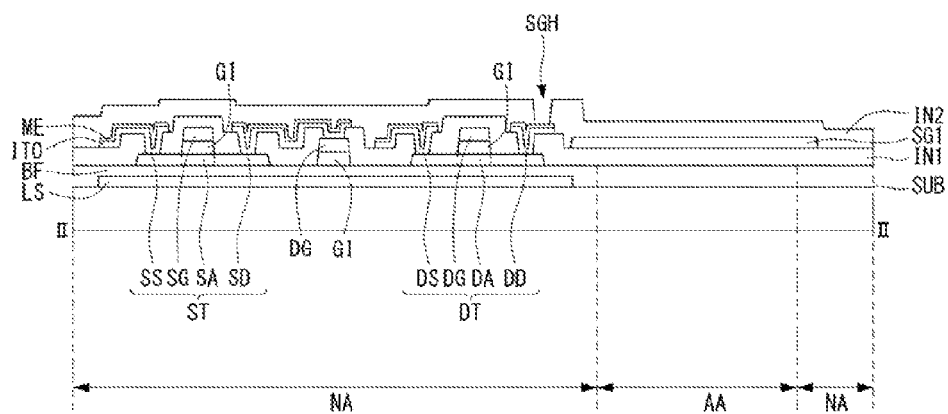

Referring to FIG. 7F, an insulating material is coated on the overall surface of the substrate SUB on which the TFTs ST and DT are formed so as to form a passivation layer IN2. The passivation layer IN2 is patterned through a sixth mask process to form a storage capacitor contact hole SGH.

Figure 7G:
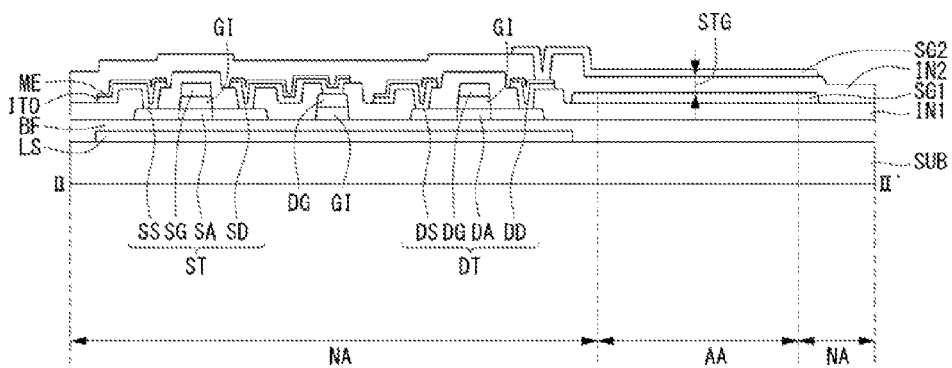

Referring to FIG. 7G, a transparent conductive material is coated on the overall surface of the substrate SUB on which the storage capacitor contact hole SGH is formed and patterned through a seventh mask process to form the second storage capacitor electrode SG2. It is desirable that the second storage capacitor electrode SG2 be formed to be superposed on the first storage capacitor electrode SG1. The second storage capacitor electrode SG2 comes into contact with the drain electrode DD of the driving TFT DT via the storage capacitor contact hole SGH.

Here, the second storage capacitor electrode SG2 is formed on the first storage capacitor electrode SG1 having the passivation layer IN2 interposed therebetween in the emission area AA so as to form the storage capacitor STG. Accordingly, the first and second storage capacitor electrodes SG1 and SG2 can be formed in the entire emission area AA without decreasing the aperture ratio of the organic light-emitting diode display according to the first embodiment of the present invention since the first and second storage capacitor electrodes SG1 and SG2 are formed of the transparent conductive material. Therefore, the organic light-emitting diode display according to the first embodiment of the present invention can secure the storage capacitor STG having sufficient capacity since the storage capacitor having a wide area can be formed.

Figure 7H:
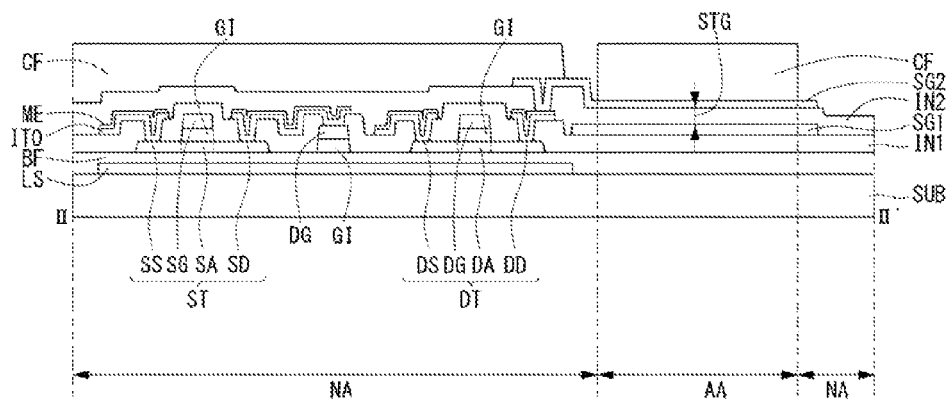

Referring to FIG. 7H, red, green and blue pigments are coated on the overall surface of the substrate SUB on which the second storage capacitor electrode SG2 is formed and sequentially patterned through eighth, ninth and tenth mask processes, respectively, to sequentially form red, green and blue color filters CF. The red, green and blue color filters CF are selectively formed in pixel regions expressing red, green and blue. Here, the red and/or green color filters may be extended and formed to cover the TFTs ST and DT in the pixel regions.

Figure 7I:
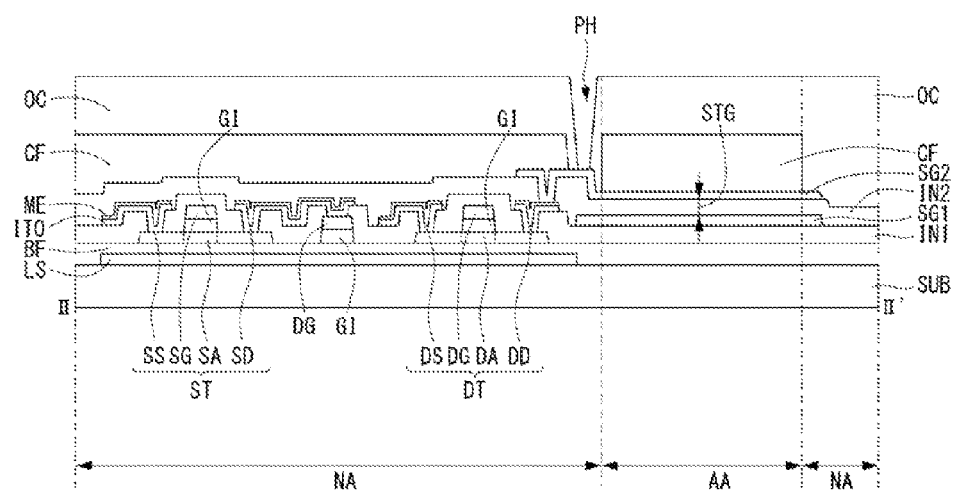

Referring to FIG. 7I, an insulating material is coated on the overall surface of the substrate SUB on which the color filters CF are formed so as to form an overcoat layer OC. The overcoat layer OC is patterned through an eleventh mask process to form a pixel contact hole PH.

Figure 7J:
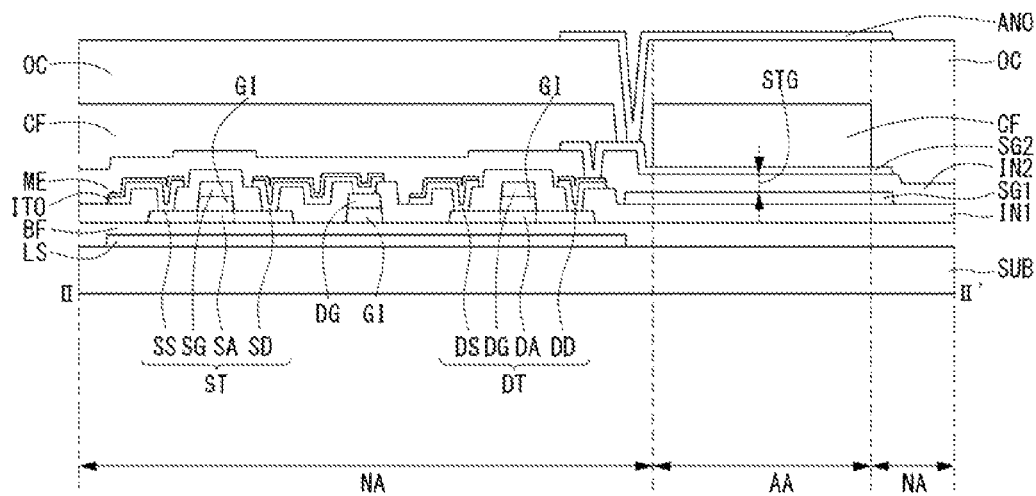

Referring to FIG. 7J, a transparent conductive material is coated on the overall surface of the substrate SUB on which the pixel contact hole PH is formed and patterned through a twelfth mask process to form the anode ANO. The anode ANO comes into contact with the second storage capacitor electrode SG2 via the pixel contact hole PH. In addition, the anode ANO is electrically connected to the drain electrode DD of the driving TFT through the second storage capacitor electrode SG2.

The organic light-emitting diode display according to the first embodiment of the present invention can secure the storage capacitor STG having sufficient capacity since the first and second storage capacitor electrodes SG1 and SG2 can be formed to have a wide area in the emission area AA without decreasing the aperture ratio. Consequently, the organic light-emitting diode display can sustain pixel data until the next period using charges of the storage capacitor STG when the driving TFT DT is in an off state.

Second Embodiment

Figure 8:
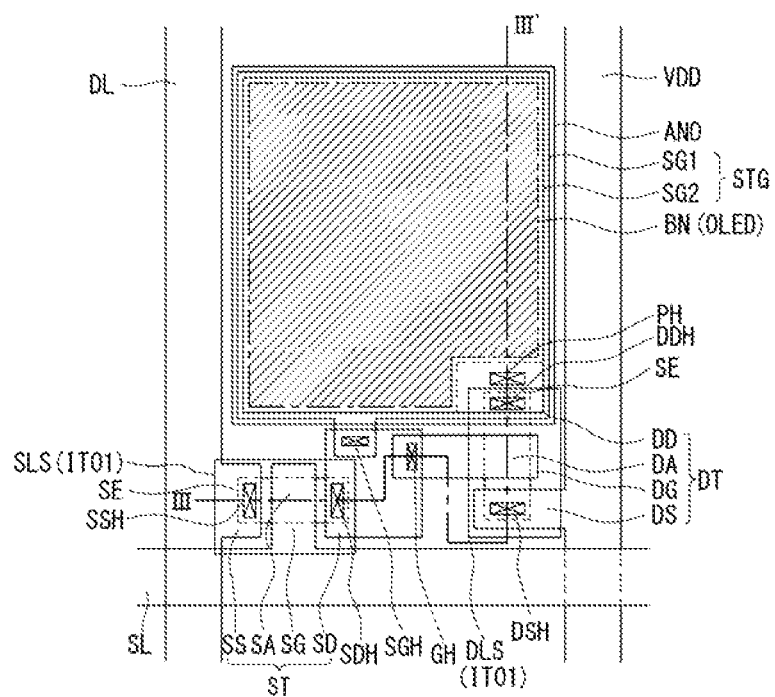
FIG. 8 is a plan view illustrating a structure of an organic light-emitting diode display according to a second embodiment of the present invention.

A description will be given of an organic light-emitting diode display according to a second embodiment of the present invention with reference to FIGS. 8 and 9. FIG. 8 is a plan view illustrating a structure of an organic light-emitting diode display according to the second embodiment of the present invention and FIG. 9 is a cross-sectional view illustrating the structure of the organic light-emitting diode display according to the second embodiment of the present invention, taken along line III-III' of FIG. 8.

Figure 9:
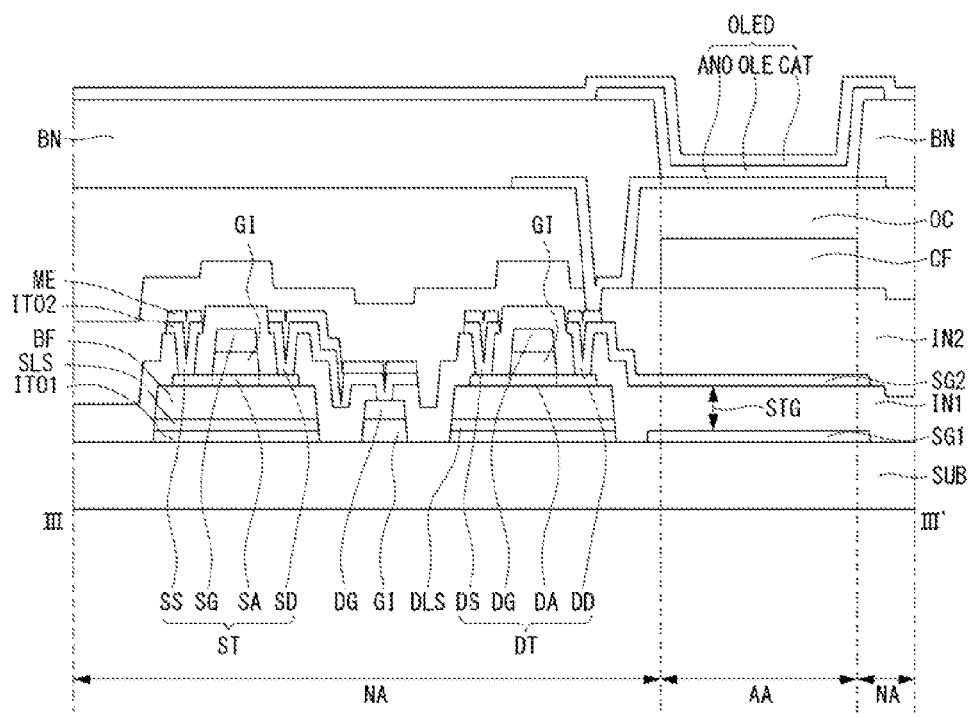
FIG. 9 is a cross-sectional view illustrating the structure of the organic light-emitting diode display according to the second embodiment of the present invention, taken along line III-III' of FIG. 8.

Referring to FIGS. 8 and 9, the organic light-emitting diode display according to the second embodiment of the present invention includes a substrate SUB in which an emission area AA and a non-emission area NA are defined, a switching TFT ST, a first storage capacitor electrode SG1 connected to the switching TFT ST, a driving TFT DT connected to the switching TFT ST, a second storage capacitor electrode SG2 connected to the driving TFT DT, a storage capacitor STG formed by the first storage capacitor electrode SG1 and the second storage capacitor electrode SG2 superposed thereon, and an organic light-emitting diode OLED connected to the driving TFT DT. The storage capacitor STG and the organic light-emitting diode OLED are formed in the emission area AA, and the TFTs ST and DT or interconnection lines SL, DL VDD are formed in the non-emission area NA.

Scan lines SL and data lines DL are formed on the substrate SUB in a matrix form so as to define pixels. The switching TFT ST is formed at an intersection of a scan line SL and a data line DL and serves to select a pixel. The switching TFT ST includes a switching gate electrode SG, a channel layer SA, a switching source electrode SS and a switching drain electrode SD. The switching gate electrode SG is branched from the scan line SL and the switching source electrode SS is branched from the data line DL.

The driving TFT DT includes a driving gate electrode DG, a channel layer DA, a driving source electrode DS and a driving drain electrode DD. The driving gate electrode DG is connected to the switching drain electrode SD and the driving source electrode DS is branched from the driving current line VDD.

A first transparent conductive layer ITO1, a light shielding layer SLS and DLS and a buffer layer BF, which have an area wider than a semiconductor layers SE of the TFTs ST and DT, are sequentially formed under the switching TFT ST and the driving TFT DT. The light shielding layer SLS and DLS serves to protect oxide semiconductor elements from external light.

More specifically, the emission area AA and the non-emission area NA are defined on the substrate SUB. The first transparent conductive layer ITO1, the light shielding layer SLS and DLS and the buffer layer BF are sequentially formed on the non-emission area NA. The semiconductor layer SE is formed on the light shielding layer SLS and DLS and the buffer layer BF such that the semiconductor layer SE has an area narrower than the light-shielding layer SLS and DLS and the buffer layer BF. A gate insulating layer GI and the gate electrodes SG and DG are sequentially formed on the semiconductor layer SE such that the gate insulating layer GI and the gate electrodes SG and DG are disposed on the center regions of the semiconductor layer SE. An interlevel insulating layer IN1 is formed on the overall surface of the substrate SUB to cover both sides of the semiconductor layer SE and the gate electrodes SG and DG. The source electrodes SS and DS and the drain electrodes SD and DD are formed on the interlevel insulating layer IN1 and respectively come into contact with both sides of the semiconductor layer SE through contact holes SSH, DSH, SDH and DDH which penetrate the interlevel insulating layer IN1. The source electrodes SS and DS and the drain electrodes SD and DD may be formed of a double layer including a second transparent conductive layer ITO2 and a metal layer ME formed thereon. Here, the drain electrode SD of the switching TFT ST and the gate electrode DG of the driving TFT DT are connected through a gate contact hole GH. In this manner, the switching TFT ST and the driving TFT DT are completed.

The second transparent conductive layer ITO2, which forms the drain electrode DD of the driving TFT DT, is extended to the emission area AA. The second transparent conductive layer ITO2 extended to the emission area AA serves as the second storage capacitor electrode SG2. The second storage capacitor electrode SG2 is superposed on the first storage capacitor electrode SG1, which is formed when the first transparent conductive layer ITO1 disposed under the light shielding layer is formed, having the interlevel insulating layer IN1 interposed therebetween so as to form the storage capacitor STG. The first storage capacitor SG1 is connected to the drain electrode SD of the switching TFT ST through a storage capacitor contact hole SGH.

Since the storage capacitor STG is formed in such a manner that the second storage capacitor electrode SG2 formed of a transparent conductive material is superposed on the first storage capacitor electrode SG1 formed of a transparent conductive material, the storage capacitor STG can be formed to have a large area without reducing the aperture ratio in the emission area AA. Accordingly, the organic light-emitting diode display according to the second embodiment of the present invention can secure a storage capacitor STG having sufficient capacity.

A passivation layer IN2 is formed on the overall surface of the substrate SUB on which the source electrodes SS and DS and the drain electrodes SD and DD of the TFTs ST and DT and the second storage capacitor electrode SG2 are formed. Part of the drain electrode DD of the driving TFT DT is exposed through a pixel contact hole PH formed in the passivation layer IN2.

Color filters CF may be formed on the second storage capacitor electrode SG2 in the emission area AA such that the color filters CF respectively correspond to pixel regions. Here, red, green and blue color filters CF may be sequentially arranged and the color filters CF may further include a white color filter CF. Here, red and/or green color filters CF may be extended to and formed on the region in which the TFTs ST and DT are formed in the pixel region so as to cover the TFTs ST and DT, which is not shown.

An overcoat layer OC, which exposes the pixel contract hole PH, is formed on the overall surface of the substrate SUB on which the color filters CF are formed. The overcoat layer OC is coated on the overall surface of the substrate SUB in order to planarize the surface of the substrate SUB on which the color filters CF are formed.

An anode ANO is formed on the overcoat layer OC to come into contact with the drain electrode DD of the driving TFT DT through the pixel contact hole PH. Accordingly, the anode ANO, the drain electrode DD of the driving TFT DT and the second storage capacitor electrode SG2 are electrically connected.

A bank BN which exposes part of the anode ANO is formed on the anode ANO. An organic emission layer OLE is formed on the exposed portion of the anode ANO, and a cathode CAT is formed on the organic emission layer OLE to cover the organic emission layer OLE. In this manner, the organic light-emitting diode OLED including the anode ANO, the organic emission layer OLE and the cathode CAT is completed.

A description will be given of a process of manufacturing the organic light-emitting diode display according to the second embodiment of the present invention with reference to FIGS. 10A to 10J. Various features of the organic light-emitting diode display according to the second embodiment of the present invention are described in more detail through the manufacturing process. FIGS. 10A to 10J are cross-sectional views illustrating a method for manufacturing the organic light-emitting diode display according to the second embodiment of the present invention.

Figure 10A:
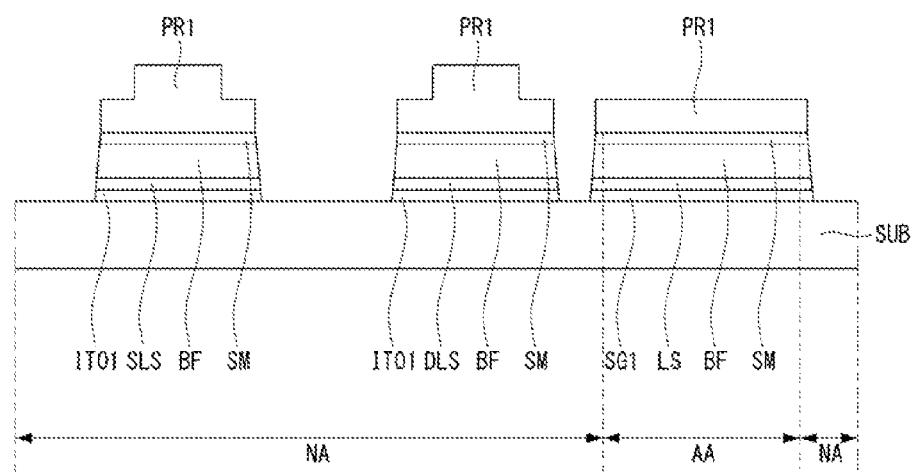
FIGS. 10A to 10J are cross-sectional views illustrating a method for manufacturing the organic light-emitting diode display according to the second embodiment of the present invention.
Figure 10B:
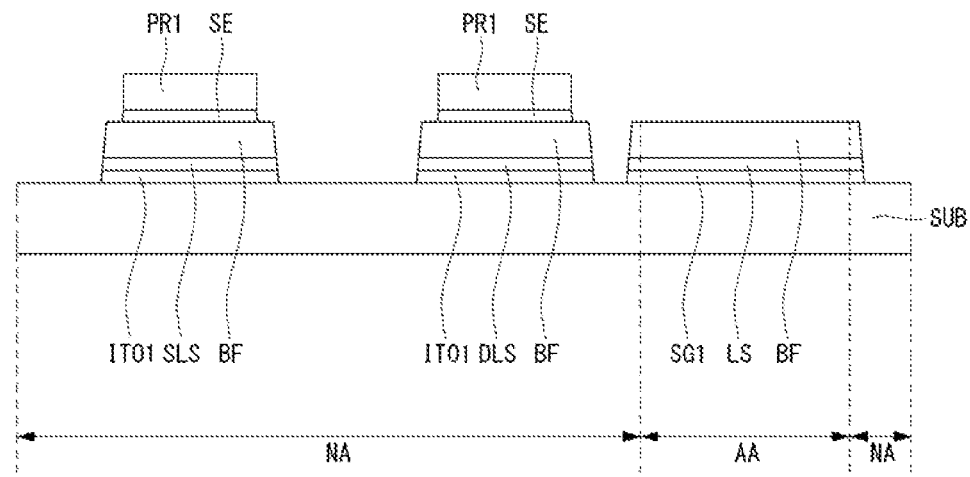

Referring to FIGS. 10A and 10B, a first transparent conductive material, an opaque light shielding material, an insulating material and a semiconductor material are sequentially coated on the overall surface of the substrate SUB. The transparent conductive material may be indium tin oxide, indium zinc oxide, indium tin zinc oxide or the like. The semiconductor material may include an oxide containing oxygen and at least one of indium, gallium, zinc and tin, for example, an oxide semiconductor material such as indium gallium zinc oxide (IGZO). The first transparent conductive material layer, the opaque light shielding material layer, the insulating material layer and the semiconductor material layer are patterned through a first mask process to form the first transparent conductive layer ITO1, the light shielding layer SLS, DLS and LS, the buffer layer BF and the semiconductor layer SE. The first conductive layer ITO1 formed on the emission area AA serves as the first storage capacitor electrode SG1.

More specifically, the first transparent conductive material, the light shielding material, the insulating material, the semiconductor material and a photoresist are sequentially coated on the substrate SUB. A half-tone mask for patterning the first transparent conductive material layer, the light-shielding material layer, the insulating material layer, the semiconductor material layer and the photoresist through the first mask is prepared. The half-tone mask includes a full-tone area for shielding light projected thereto, a half-tone area for transmitting part of light projected thereto and shielding part thereof, and an area for completely transmitting light projected thereto. Light is selectively projected through the prepared half-tone mask. Here, the photoresist may be of positive type or negative type. A case in which a positive type photoresist is used is will now be described.

When the photoresist exposed through the half-tone mask is developed, photoresist patterns PR1 corresponding to the full-tone area and the half-tone area of the half-tone mask remain. Here, the photoresist pattern PR1 corresponding to the full-tone area is thicker than the photoresist pattern PR1 corresponding to the half-tone area. The first transparent conductive material layer, the light shielding material layer, the insulating material layer and the semiconductor material layer are primarily patterned using the remaining photoresist patterns PR1. The light shielding layer SLS, DSL and LS and the buffer layer BF are formed according to the primary patterning. The first transparent conductive layer ITO1 remains beneath the light shielding layer SLS, DLS and LS.

Here, the first transparent conductive layer remaining on the emission area AA serves as the first storage capacitor electrode SG1. Semiconductor layer patterns SM formed through primary patterning remain on the buffer layer BF (FIG. 10A).

Subsequently, an asking process for removing the photoresist patterns PR1 by a predetermined thickness is performed such that only the photoresist pattern PR1 corresponding to the full-tone area remains. The semiconductor patterns SM are secondarily patterned using the remaining photoresist pattern PR1 so as to form semiconductor layers SE. Here, the semiconductor pattern SM on the emission area AA is removed. Subsequently, the remaining photoresist pattern PR1 is removed through a stripping process (FIG. 10B).

The light shielding layer SLS and DLS has an area wider than the semiconductor layers SE according to patterning using the half-tone mask. The light shielding layer SLS and DLS serves to protect oxide semiconductor elements from external light. Accordingly, it is desirable that the light shielding layer SLS and DLS be superposed on the semiconductor layers SE while having a wider area than the semiconductor layers SE in order to effectively protect the semiconductor layers SE.

Figure 10C:
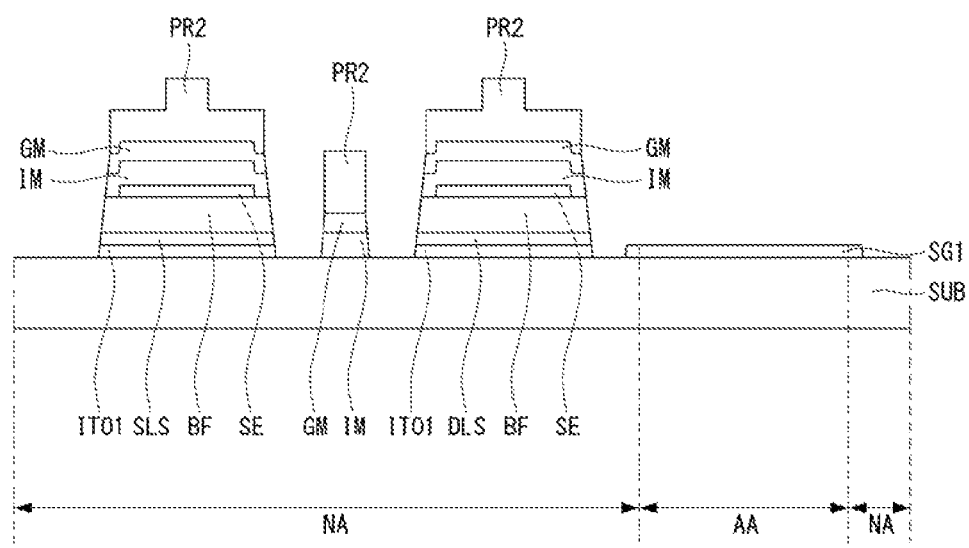
Figure 10D:
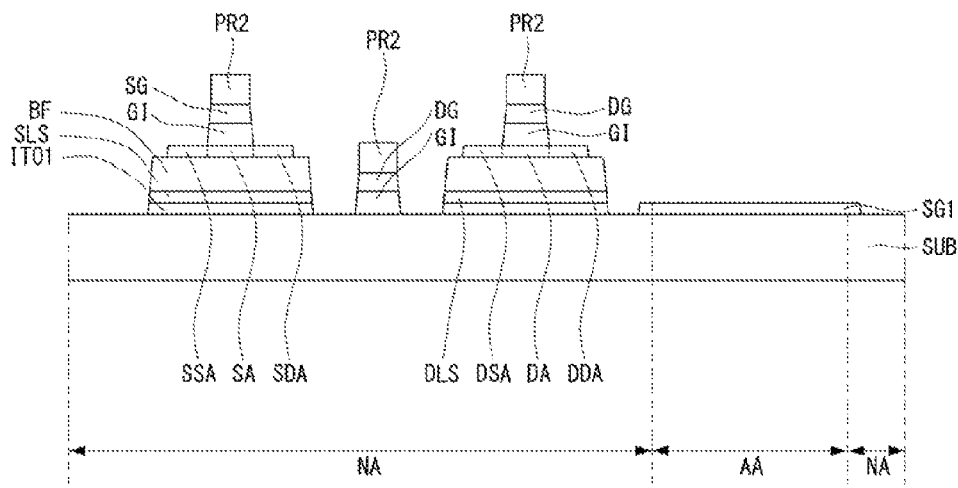

Referring to FIGS. 10C and 10D, an insulating material and a metal material are sequentially coated on the overall surface of the substrate SUB on which the semiconductor layers SE are formed and simultaneously patterned through a second mask process to form the gate insulating layer GI and the gate electrodes SG and DG superposed thereon. The gate electrodes SG and DG are formed such that the gate electrodes SG and DG are respectively disposed on the center regions of the semiconductor layers SE while exposing both sides of the semiconductor layers SE. The center regions of the semiconductor layer SE are respectively defined as a channel layer SA of the switching TFT and a channel layer DA of the driving TFT. The exposed portions of the semiconductor layers SE become source regions SSA and DSA and drain regions SDA and DDA respectively coming into contact with the source electrodes and the drain electrodes of the switching TFT and the driving TFT. When the semiconductor material is an oxide semiconductor material, the source regions SSA and DSA and the drain regions SDA and DDA may be conductorized through a plasma treatment process.

The second mask process is performed using a half-tone mask. An insulating layer, a metal material and a photoresist are sequentially coated on the overall surface of the substrate SUB on which the semiconductor layers SE are formed. Then, light is selectively projected through the half-tone mask. When the photoresist exposed through the half-tone mask is developed, photoresist patterns PR2 corresponding to the full-tone area and the half-tone area of the half-tone mask remain. Here, the photoresist pattern PR2 corresponding to the full-tone area is thicker than the photoresist pattern PR2 corresponding to the half-tone area. The insulating material layer and the metal material layer are primarily patterned using the remaining photoresist patterns PR2. According to primary patterning, an insulating material pattern IM and a metal pattern GM are formed. Here, the light shielding layer LS and the buffer layer BF formed on the first storage capacitor electrode SG1 are removed (FIG. 10C).

Subsequently, an asking process for removing the photoresist patterns PR2 by a predetermined thickness is performed such that only the photoresist pattern PR2 corresponding to the full-tone area remains. The insulating material pattern IM and the metal pattern GM are secondarily patterned using the remaining photoresist pattern PR2 so as to form the gate insulating layer GI and the gate electrodes SG and DG superposed thereon. Subsequently, the remaining photoresist pattern PR2 is removed through a stripping process (FIG. 10D).

Figure 10E:
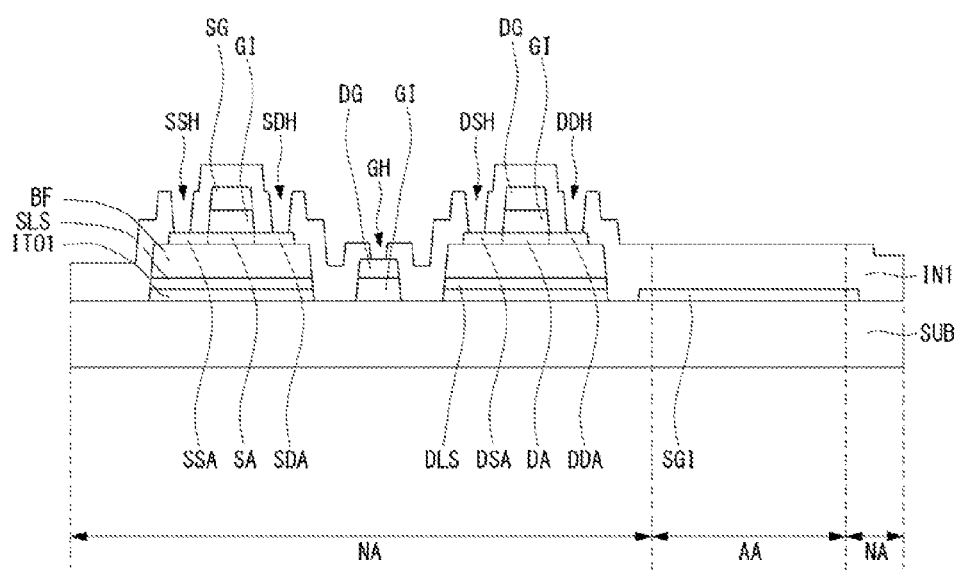

Referring to FIG. 10E, an insulating material is coated on the overall surface of the substrate SUB on which the gate electrodes SG and DG are formed so as to form an interlevel insulating layer IN1. The interlevel insulating layer IN1 is patterned through a third mask process to form contact holes SSH and DSH for exposing the source regions SSA and DSA of the semiconductor layers and contact holes SDH and DDH for exposing the drain electrodes SDA and DDA of the semiconductor layers. Here, a gate contact hole GH for exposing part of the gate electrode DG of the driving TFT is simultaneously formed. Furthermore, the storage capacitor contact hole SGH (refer to FIG. 8) for exposing part of the first storage capacitor electrode SG1 is formed, which is not shown.

Figure 10F:
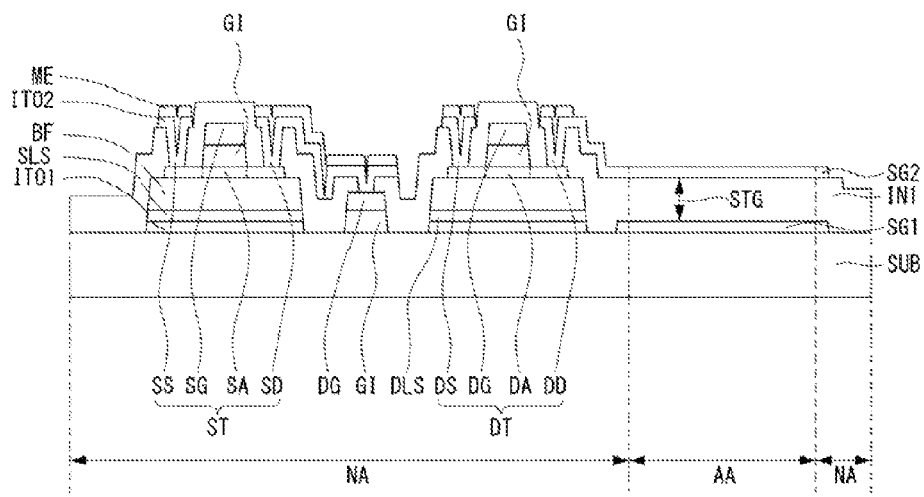

Referring to FIG. 10F, a second transparent conductive material and a metal material are sequentially coated on the interlevel insulating layer IN1 in which the contact holes are formed. The second transparent conductive material layer and the metal layer are patterned through a fourth mask process to form the source electrode SS and the drain electrode SD of the switching TFT ST and the source electrode DS and the drain electrode DD of the driving TFT DT. The second storage capacitor electrode SG2 is formed of the second transparent conductive material in the emission area AA. Here, the drain electrode DD of the driving TFT DT and the second storage capacitor electrode SG2, which are formed of the second transparent conductive material, are connected as one body. It is desirable that the second storage capacitor electrode SG2 is superposed on the first storage capacitor electrode SG1.

The drain electrode SD of the switching TFT ST is connected to the gate electrode DG of the driving TFT. In addition, the drain electrode SD of the switching TFT ST is connected to the first storage capacitor electrode SG1 through the storage capacitor contact hole SGH (FIG. 8).

The second storage capacitor electrode SG2 is formed on the first storage capacitor electrode SG1 having the interlevel insulating layer IN1 interposed therebetween in the emission area AA so as to form the storage capacitor STG. Accordingly, the first and second storage capacitor electrodes SG1 and SG2 can be formed in the entire emission area AA without decreasing the aperture ratio of the organic light-emitting diode display according to the second embodiment of the present invention since the first and second storage capacitor electrodes SG1 and SG2 are formed of the transparent conductive material. Therefore, the organic light-emitting diode display according to the second embodiment of the present invention can secure the storage capacitor STG having sufficient capacity since the storage capacitor STG having a wide area can be formed.

The fourth mask process is performed using a half-tone mask. By using the half-tone mask, the source electrode SS and the drain electrode SD of the switching TFT ST and the source electrode DS and the drain electrode DD of the driving TFT DT are formed of a double layer including the second transparent conductor layer ITO2 and the metal material ME, and the second storage capacitor electrode SG2 is formed of a single layer including only the second transparent conductive layer 1102. While the source electrodes SS and DS and the drain electrodes SD and DD of the TFTs ST and DT may be formed of a single layer including only the second transparent conductive material ITO2, it is desirable that the source electrodes SS and DS and the drain electrodes SD and DD be formed of a double layer including the second transparent conductive material ITO2 and metal material ME formed thereon, considering that the second transparent conductive material ITO2 has high sheet resistance.

Figure 10G:
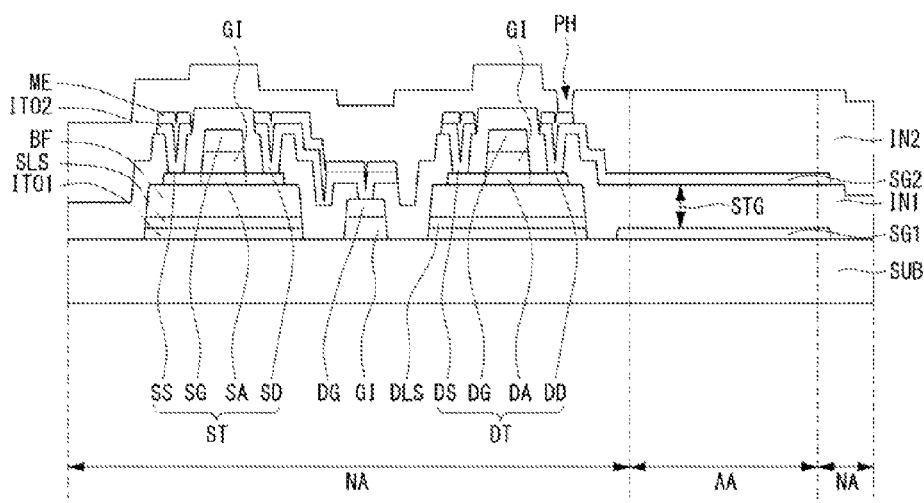

Referring to FIG. 10G, an insulating material is coated on the overall surface of the substrate SUB on which the TFTs ST and DT are formed so as to form a passivation layer IN2. Subsequently, the passivation layer IN2 is patterned through a fifth mask process to form the pixel contact hole PH.

Figure 10H:
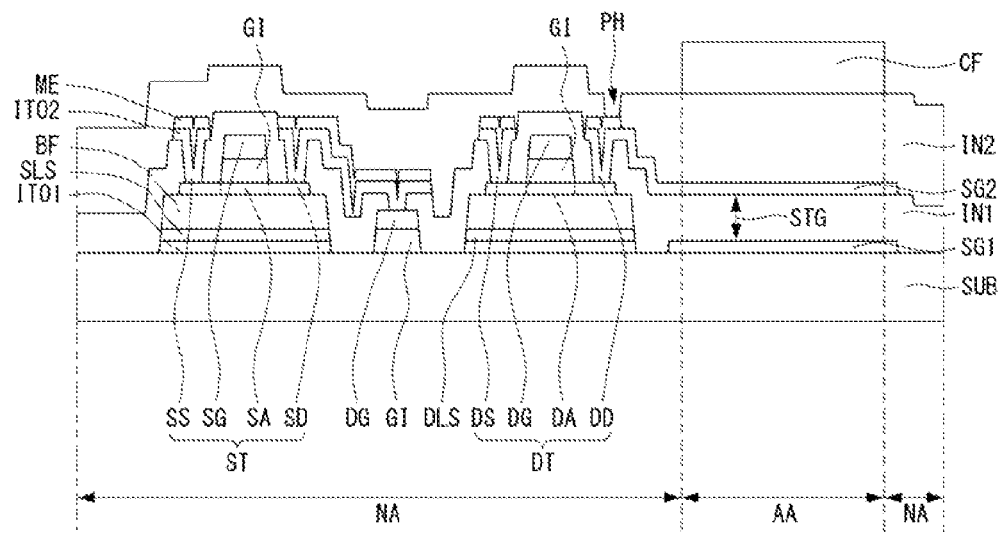

Referring to FIG. 10H, red, green and blue pigments are coated on the overall surface of the substrate SUB on which the second storage capacitor electrode SG2 is formed and sequentially patterned through sixth, seventh and eighth mask processes, respectively, to sequentially form red, green and blue color filters CF. The red, green and blue color filters CF are selectively formed in pixel regions expressing red, green and blue.

Figure 10I:
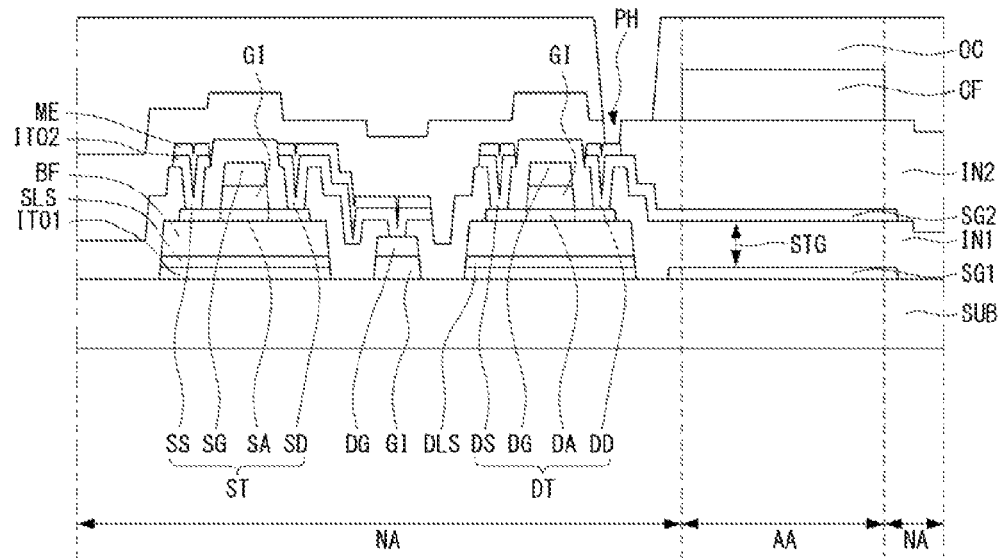

Referring to FIG. 10I, a photosensitive insulating material is coated on the overall surface of the substrate SUB on which the color filters CF are formed so as to form an overcoat layer OC. The overcoat layer OC is patterned through a ninth mask process to form the pixel contact hole PH.

Figure 10J:
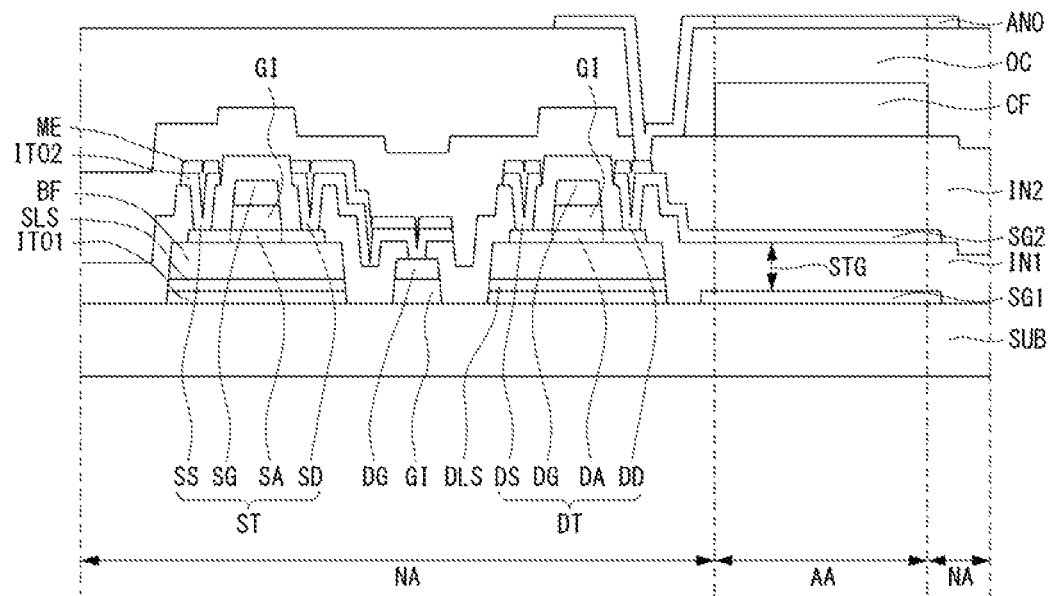

Referring to FIG. 10J, a third transparent conductive material is coated on the overall surface of the substrate SUB on which the pixel contract hole PH and the overcoat layer OC are formed and patterned through a tenth mask process to form the anode ANO. The anode ANO comes into contact with the drain electrode DD of the driving TFT DT through the pixel contact hole PH. Accordingly, the anode ANO, the drain electrode DD of the driving thin film transistor DT and the second storage capacitor electrode SG2 are electrically connected.

The organic light-emitting diode display according to the second embodiment of the present invention can secure the storage capacitor STG having sufficient capacity since the first and second storage capacitor electrodes SG1 and SG2 can be formed to have a wide area in the emission area AA without decreasing the aperture ratio. Consequently, the organic light-emitting diode display can sustain pixel data until the next period using charges of the sufficient storage capacitor STG when the driving TFT DT is in an off state.

Furthermore, the second embodiment of the present invention can reduce two mask processes before the formation of the anode ANO, compared to the first embodiment. Accordingly, a plurality of processing steps, such as exposure, development, etching and cleaning, included in a mask process can be reduced, and thus the manufacturing process can be simplified and the manufacturing cost and time can be decreased. Furthermore, a defect generation rate can be reduced, improving production yield.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light-emitting diode display, comprising:
    a substrate in which an emission area and a non-emission area are defined;
    a first transparent conductive layer, a light shielding layer, a buffer layer and a semiconductor layer sequentially laminated on the non-emission area;

a gate electrode superposed on a center region of the semiconductor layer, and having a gate insulating layer interposed therebetween;

a drain electrode coming into contact with one side of the semiconductor layer, having an interlevel insulating layer covering the gate electrode interposed therebetween, and formed of a second transparent conductive layer and a metal layer laminated thereon;

a first storage capacitor electrode disposed under the interlevel insulating layer in the emission area and formed of the first transparent conductive layer; and a second storage capacitor electrode superposed on the first storage capacitor electrode in the emission area, having the interlevel insulating layer interposed therebetween, and formed of the second transparent conductive layer, wherein the buffer layer and the semiconductor layer are patterned to be disposed on the light shielding layer and not to be disposed on the first storage capacitor electrode.

2. The organic light-emitting diode display of claim 1, further comprising:

a source electrode coming into contact with the other side of the semiconductor layer, having the interlevel insulating layer interposed therebetween, formed of the second transparent conductive layer and the metal layer laminated thereon, and disposed at a predetermined distance from the drain electrode;

an overcoat layer disposed on the source electrode, the drain electrode and the second storage capacitor electrode; and an anode disposed on the overcoat layer and coming into contact with part of the drain electrode.

3. The organic light-emitting diode display of claim 1, wherein the first transparent conductive layer and the first storage capacitor electrode are formed of a same material and disposed at a same level.

4. The organic light-emitting diode display of claim 1, wherein the second storage capacitor electrode is disposed in such a manner that the second transparent conductive layer of the drain electrode is extended to the emission area.

5. A method for manufacturing an organic light-emitting diode display, the method comprising:

forming a first transparent conductive layer, a light shielding layer, a buffer layer and a semiconductor layer on a non-emission area of a substrate using a first transparent conductive material, a light shielding material, an insulating material and a semiconductor material, respectively, and forming a first storage capacitor electrode on an emission area of the substrate using the first transparent conductive material;

forming a gate electrode superposed on a center region of the semiconductor layer and having a gate insulating layer interposed therebetween;

forming an interlevel insulating layer on the overall surface of the substrate on which the gate electrode is formed; and forming, on the interlevel insulating layer, a drain electrode coming into contact with one side of the semiconductor layer and formed of a second transparent conductive layer and a metal layer laminated thereon, a source electrode coming into contact with the other side of the semiconductor layer and formed of the second transparent conductive layer and the metal layer laminated thereon, and a second storage capacitor electrode superposed on the first storage capacitor electrode and formed of the second transparent conductive layer of the drain electrode, extended to the emission area, wherein the buffer layer and the semiconductor layer are patterned to be disposed on the light shielding layer and not to be disposed on the first storage capacitor electrode.

6. The method of claim 5, further comprising:

forming an overcoat layer on the overall surface of the substrate on which the source electrode, the drain electrode and the second storage capacitor electrode are formed; and forming an anode coming into contact with part of the drain electrode on the overcoat layer.

7. The organic light-emitting diode display of claim 1, wherein the drain electrode and the second storage capacitor electrode share one layer, and wherein the number of layers constituting the drain electrode and the second storage capacitor electrode is different from each other.

\* \* \* \* \*